(12) United States Patent
Wang et al.

(10) Patent No.: US 9,408,306 B2
(45) Date of Patent: Aug. 2, 2016

(54) ANTENNA ARRAY FEEDING STRUCTURE HAVING CIRCUIT BOARDS CONNECTED BY AT LEAST ONE SOLDERABLE PIN

(71) Applicant: Honeywell International Inc., Morristown, NJ (US)

(72) Inventors: Nan Wang, Shang Hai (CN); Orville Nyhus, Glendale, AZ (US); Chao Wang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 196 days.

(21) Appl. No.: 14/155,920

(22) Filed: Jan. 15, 2014

(65) Prior Publication Data
US 2015/0201494 A1 Jul. 16, 2015

(51) Int. Cl.
*H05K 1/14* (2006.01)
*H01Q 21/00* (2006.01)
*H05K 1/02* (2006.01)
(Continued)

(52) U.S. Cl.
CPC ............... *H05K 1/144* (2013.01); *H01P 3/084* (2013.01); *H01Q 1/002* (2013.01); *H01Q 21/0081* (2013.01); *H05K 1/0251* (2013.01); *H05K 1/0298* (2013.01); *H05K 1/115* (2013.01); *H05K 1/14* (2013.01); *H05K 3/10* (2013.01); *H05K 3/46* (2013.01); *H01L 2224/00* (2013.01); *H01Q 1/246* (2013.01); *H01Q 1/50* (2013.01); *H05K 2201/10007* (2013.01); *Y10T 29/49126* (2015.01); *Y10T 29/49155* (2015.01)

(58) Field of Classification Search
CPC ......... H01P 3/084; H01P 3/087; H01P 5/085; H01P 3/082; H01P 3/088; H01Q 1/002; H05K 1/144

USPC .................................................... 333/260, 246
See application file for complete search history.

(56) References Cited

U.S. PATENT DOCUMENTS 4,262,265 A  4/1981  Nygren et al.
4,383,226 A  5/1983  Nygren et al.
(Continued)

FOREIGN PATENT DOCUMENTS

DE  102004063784  7/2006
DE  102005063234  6/2007

OTHER PUBLICATIONS

European Patent Office, "Extended European Search Report from EP Application No. 15150542.7 mailed Jun. 11, 2015", "from Foreign Counterpart of U.S. Appl. No. 14/155,920", Jun. 11, 2015, pp. 1-11, Published in: EP.
(Continued)

*Primary Examiner* — Benny Lee
(74) *Attorney, Agent, or Firm* — Fogg & Powers LLC

(57) ABSTRACT

Systems and methods for a feeding structure for an antenna array are provided. In at least one embodiment, the feeding structure for an antenna array comprises one or more circuit boards with one or more circuits formed thereon, one or more conductive layers wherein the one or more circuit boards are mounted to the one or more conductive layers, and one or more connectors coupled to the one or more circuits through an opening in the one or more conductive layers. Furthermore, the one or more conductive layers are separated by a dielectric from the one or more circuits and the one or more conductive layers contact the one or more circuit boards such that the one or more circuits are isolated from the one or more conductive layers.

11 Claims, 7 Drawing Sheets

(51) Int. Cl.
*H05K 1/11* (2006.01)
*H05K 3/46* (2006.01)
*H05K 3/10* (2006.01)
*H01Q 1/00* (2006.01)
*H01P 3/08* (2006.01)
H01Q 1/24 (2006.01)
H01Q 1/50 (2006.01)

(56) References Cited

U.S. PATENT DOCUMENTS

| | | |
|---|---|---|
| 4,614,947 A | 9/1986 | Rammos |
| 5,061,943 A | 10/1991 | Rammos |
| 5,471,181 A | 11/1995 | Park |
| 6,366,185 B1 | 4/2002 | Keesey et al. |
| 6,621,469 B2 | 9/2003 | Judd et al. |
| 6,727,777 B2 | 4/2004 | McDonough et al. |
| 2004/0048420 A1* | 3/2004 | Miller ............... H01P 3/084 438/127 |
| 2005/0168301 A1 | 8/2005 | Carson |
| 2009/0278761 A1 | 11/2009 | Makinen et al. |
| 2013/0070819 A1 | 3/2013 | Zhao et al. |
| 2013/0342280 A1* | 12/2013 | Blanton ............... H01P 5/02 333/33 |

OTHER PUBLICATIONS

Inclan-Alonso et al., "Low Loss Power Distribution Network in Stripline Technology for Planar Array Antennas", "Progress in Electromagnets Research", Nov. 13, 202013, pp. 369-384, vol. 143.
Wang et al., "Integrated Stripline Feed Network for Linear Antenna Array", "U.S. Appl. No. 13/879,300", Apr. 12, 2013, pp. 1-18, Published in: US.
European Patent Office, Office Action from EP Application No. 15150542.7 mailed May 23, 2016, from Foreign Counterpart of U.S. Appl. No. 14/155,920, May 23, 2016, pp. 1-8, Published in: EP.

* cited by examiner

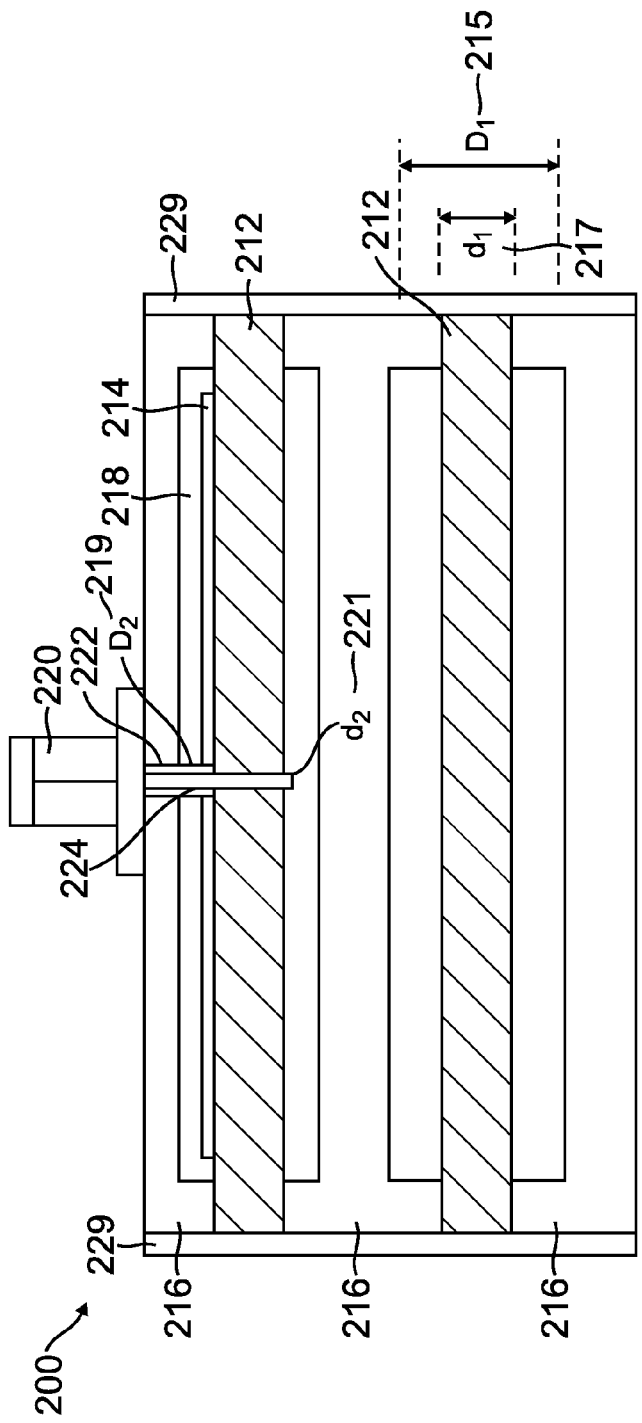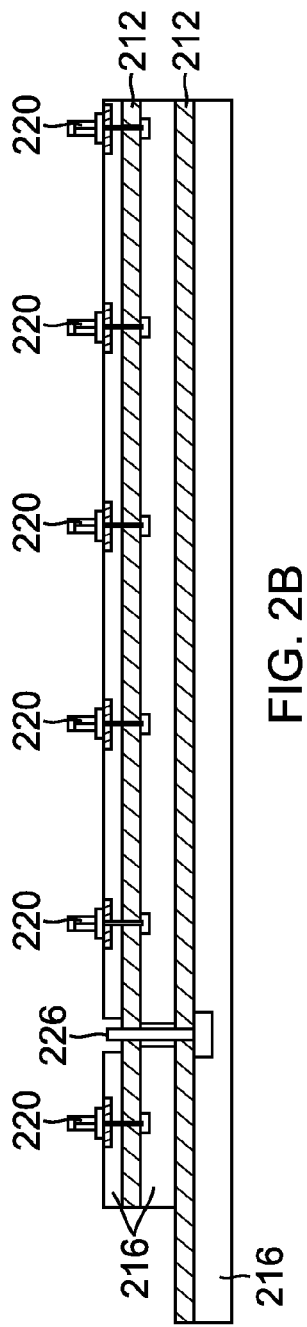

ANTENNA ARRAY FEEDING STRUCTURE
HAVING CIRCUIT BOARDS CONNECTED BY
AT LEAST ONE SOLDERABLE PIN

BACKGROUND

A system for driving antennas plays a key role in achieving desired antenna performance. In certain implementations, like when an antenna is part of an antenna array, considerations of performance, cost, complexity, and reliability affect the design of the antenna driving system. If an antenna system is outdoors, to aid in the performance and reliability of the system in the case of a lightning strike, it is useful to incorporate lightning protection equipment into the system. One exemplary solution for providing lightning protection is to install a lightning rod close to the antenna. Another exemplary solution is to integrate a lightning protection rod into the antenna array system.

For some linear antenna array systems, the antenna driving system has been deployed inside a center metal pipe used to support the antenna array, so that the antenna driving system is isolated from radiators that occur outside but close to the center pipe. Both the lightning ground connection and the driving circuits may be arranged inside the center pipe. In constructing the driving circuits inside the center pipe, some driving circuits use RF cables and some use striplines or microstrip lines. The microstrip lines and striplines are more lossy than their RF counterparts, so when the insertion loss is critical to the system performance, the higher-loss stripline structure is restricted for use in applications such as the one discussed above or other applications where the insertion loss is less critical to the system performance.

SUMMARY OF THE INVENTION

Systems and methods for a feeding structure for an antenna array are provided. In at least one embodiment, the feeding structure for an antenna array comprises one or more circuit boards with one or more circuits formed thereon, one or more conductive layers wherein the one or more circuit boards are mounted to the one or more conductive layers, and one or more connectors coupled to the one or more circuits through an opening in the one or more conductive layers. Furthermore, the one or more conductive layers are separated by a dielectric from the one or more circuits and the one or more conductive layers contact the one or more circuit boards such that the one or more circuits are isolated from the one or more conductive layers.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which:

FIGS. 2A-2B illustrate example embodiments of cross-sectional views of a feeding structure for an antenna array.

Figure 1A:
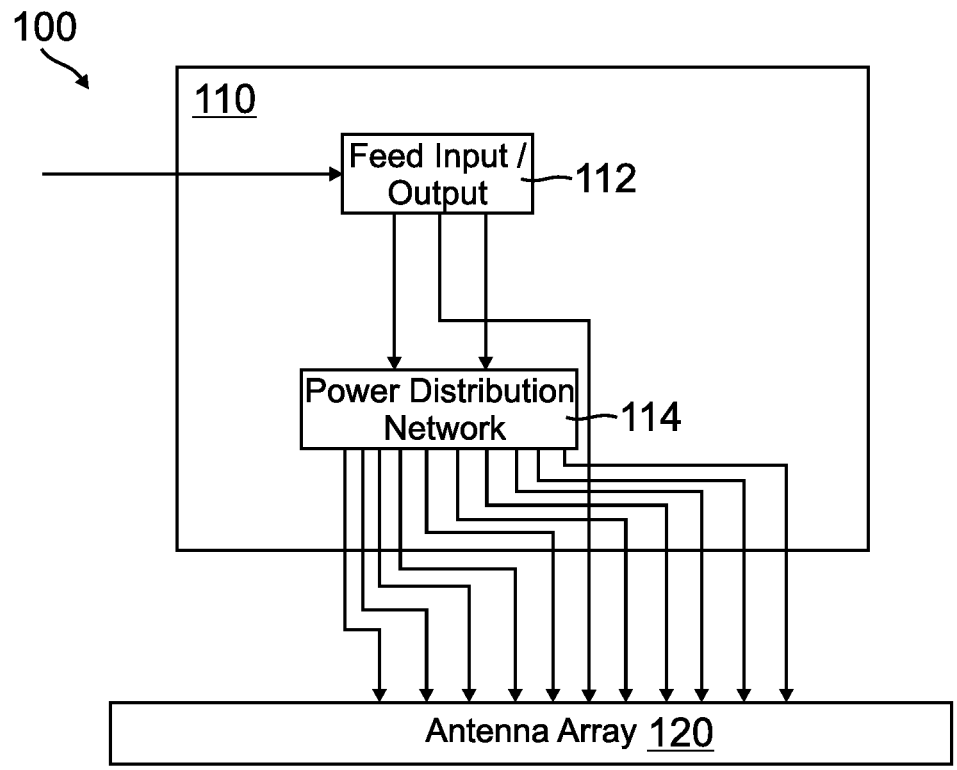
FIG. 1A illustrates a high-level functional block diagram of a feed network and an antenna array according to one embodiment.

In accordance with common practice, the various described features are not drawn to scale but are drawn to emphasize specific features relevant to the exemplary embodiments.

DETAILED DESCRIPTION OF THE INVENTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments described in the present disclosure provide systems and methods for a suspended stripline antenna driving system. To suspend the stripline antenna driving system, one or more circuit boards with one or more circuits printed thereon are mounted on one or more conductive layers. The one or more circuit boards are mounted on the one or more conductive layers in such a way that the one or more circuit boards are supported by the one or more conductive layers, but also any circuits printed on the circuit boards are isolated from the one or more conductive layers by a dielectric. In this application, isolated means that the surface of the one or more circuits is separated from the one or more conductive layers by a dielectric. In some embodiments, isolated can also entail that the one or more circuits be electrically isolated from the one or more conductive layers; however, being electrically isolated is not a requirement for the one or more circuits to be isolated from the one or more conductive layers. That is, in some other embodiments, isolated may entail that the surface of the one or more circuits is separated from the one or more conductive layers by a dielectric, but, in addition, the one or more conductive layers provide a ground connection to one or more circuits. One example embodiment of how this can be accomplished is shown in FIG. 2 below. The above described suspended structure of the circuit boards helps reduce the loss due to using striplines and microstrip lines as the suspended structure has less loss than other conventional stripline structures. Additionally, the driving circuit is protected from a lightning strike by assembling the driving circuit board onto a metal ground bar that has a sufficient cross-section for carrying current due to a lightning strike. Advantageously, this metal ground bar functions as both a microwave ground and a lightning ground.

Figure 1B:
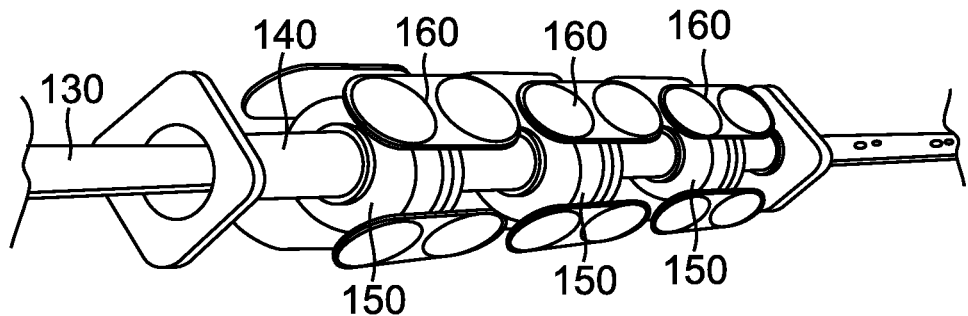
FIG. 1B is a diagram of a feed network and an antenna array according to one embodiment.

FIG. 1A illustrates a high-level functional block diagram of a system 100 for a linear antenna array 120 and integrated stripline feed network system 110 according to one embodiment. The system 100 includes an integrated stripline feed network 110 that feeds an antenna array 120. In certain implementations, the feed network 110 includes a feed input/output component 112 that receives an input feed signal from a source and may then split the signal into three output channels using a standard 2-way power divider like a Wilkinson Power Divider. One of the three channels in this example is directly connected to an output channel of the feed network 110, which provides the most powerful feed signal from the feed input/output component 112. This output channel directly feeds the center antenna element of an antenna array 120. The remaining two channels may either feed the left or right side of the antenna array 120 through a power distribution network 114. This feed network 110 can be implemented in approximately 2-3 layers of stripline in a multilayered printed circuit board (PCB) 130. FIG. 1B illustrates the integration of the PCB 130, which has the feed network implemented on it, into a support body 140. The feed signal from the PCB 130 is fed to bays 150 and then to the radiating elements 160. This system allows for a compact, low cost feed system.

More information describing embodiments of an integrated stripline feed network, such as feed network 110, are described in the patent application publication number 2015/0333411 entitled INTEGRATED STRIPLINE FEED NETWORK FOR LINEAR ANTENNA ARRAY, which was filed in the national stage from a PCT application on Apr. 12, 2013. The patent application having patent application publication number 2015/0333411 is hereby incorporated herein in its entirety by reference.

FIGS. 2A and 2B show a front cross-sectional view and a side cross-sectional view, respectively, of an example embodiment of a feeding structure for an antenna array implemented on a circuit board. The example embodiment shown in FIGS. 2A and 2B includes the following: two circuit boards 212, wherein a circuit 214 in FIG. 2A is formed thereon; one or more conductive layers 216, wherein the one or more conductive layers 216 are separated by a dielectric 218 in FIG. 2A from the circuit 214. Additionally, the two circuit boards 212 are mounted on the one or more conductive layers 216 and contact the two circuit boards 212 such that the circuit 214 is isolated from the one or more conductive layers 216. Finally, one or more connectors 220 are coupled to the one or more circuits through an opening 222 in FIG. 2A in the conductive layer supporting the one or more connectors.

As known to one having skill in the art, a circuit board mechanically supports and electrically connects electronic components using conductive material laminated onto a non-conductive substrate. A circuit board of this type is also known as a printed circuit board (PCB). The one or more circuits 214 on the one or more circuit boards 212 in this embodiment include a feed input/output component 112 and a power distribution network 114, as described in the example embodiment in FIG. 1A. As discussed above, in some embodiments, the one or more circuit boards 212 can be multilayered so that output channels having varying strengths can be on different layers of the one or more circuit boards 212. That is, as discussed above in FIG. 1A, the feed input/output component 112 can include an input feed signal from a source that can be split using a power divider into two output channels, where one output channel is distributed onto a first layer that directly feeds a center antenna in the antenna array and where the other output channel is further split using a power divider into two more output channels that are fed onto a second layer. The two outputs that are on the second layer can be fed into a power distribution network 114 that includes more power dividers in order to feed either the left or right side of the antenna array. The number of times the signal is divided can depend on the number of antenna elements that are on the left and right side of the antenna array.

Additionally, the one or more circuits 214 that are formed on the one or more circuit boards 212 can be laminated onto the circuit board 212 so that the conductive layers 216 mechanically support the one or more circuit boards 212 without coming into contact with the one or more circuits 214. As shown in FIG. 2A, this entails forming the one or more circuits 214 onto the one or more circuit boards 212, but isolated from the conductive layers 216 by a dielectric 218, so that when the conductive layers 216 contact the one or more circuit boards 212, they will not contact any of the one or more circuits 214. In some embodiments, the dielectric 218 separating the one or more conductive layers 216 from the one or more circuits 214 can be air. In some embodiments, the one or more circuit boards 212 can include a first circuit board and a second circuit board as shown in FIGS. 2A and 2B. In other embodiments, the one or more circuit boards may include multiple circuit boards as called for by the design requirements of the feeding structure and the support body for the feeding structure.

The one or more conductive layers 216 can be any material which permits the flow of electric charges. As stated above and shown in FIG. 2A, the one or more conductive layers 216 surround the one or more circuit boards 212; however, the conductive layers 216 are also isolated from the one or more circuits 214 on the one or more circuit boards 212 by a dielectric 218. Therefore, the one or more circuit boards 212 are suspended inside the one or more conductive layers 216. As noted above, in some embodiments, the dielectric 218 that separates the one or more conductive layers 216 from the one or more circuits 214 can be air. In addition, in some embodiments, the separation of the surfaces of the conductive layers 216 in relation to the thickness of the one or more circuit boards 212, where $d_1$ is the thickness 217 of the circuit board 212 and $D_1$ is the distance 215 between the surfaces of the two conductive layers as shown in FIG. 2A, can follow the formula:

$$Z_0 \approx \frac{138\Omega}{\sqrt{\varepsilon_r}} \log_{10} \frac{D_1}{d_1}$$

where $\varepsilon_r$ is the relative dielectric constant and $Z_0$ is the characteristic impedance. That is, the distance 215, $D_1$, between the surfaces of the two conductive layers in proportion to the thickness 217, $d_1$, of the circuit board is such that the one or more circuit's characteristic impedance can match the characteristic impedance of other devices it connects to, such as the one or more connectors' characteristic impedance. In an example, if $Z_0=50\Omega$ and the dielectric is air so that $\varepsilon_r=1$, then $D_1=2.303*d_1$. That is, the separation between the surfaces of the two conductive layers 216 is 2.303 times as large as the width of the one or more circuit board 212, as shown in FIG. 2B, so that the characteristic impedance of the circuit will be $50\Omega$.

In addition to the one or more circuits 214 formed on the one or more circuit boards 212 being separated by a dielectric 218, the one or more conductive layers 216 contacts the one or more circuit boards 212, but in a way that the one or more circuits 214 formed on the one or more circuit boards 212 are isolated from the one or more conductive layers 216. In some embodiments, the one or more conductive layers 216 can contact and support the one or more circuit boards 212 at the edges of the one or more conductive layers 216 without contacting the one or more circuits 214 formed on the one or more circuit boards 212, as shown in FIG. 2A. As noted above, there are other embodiments where the one or more conductive layers 216 will support the one or more circuit boards 212 while still being isolated from the one or more circuits 214 printed on the one or more circuit boards 212, and therefore, FIG. 2A is not meant to be limiting. In addition, in some embodiments, the one or more conductive layers 216 can be shorted together using one or more shorting members 229 on each side of the feeding structure 200, as shown in FIG. 2A.

Figure 3:
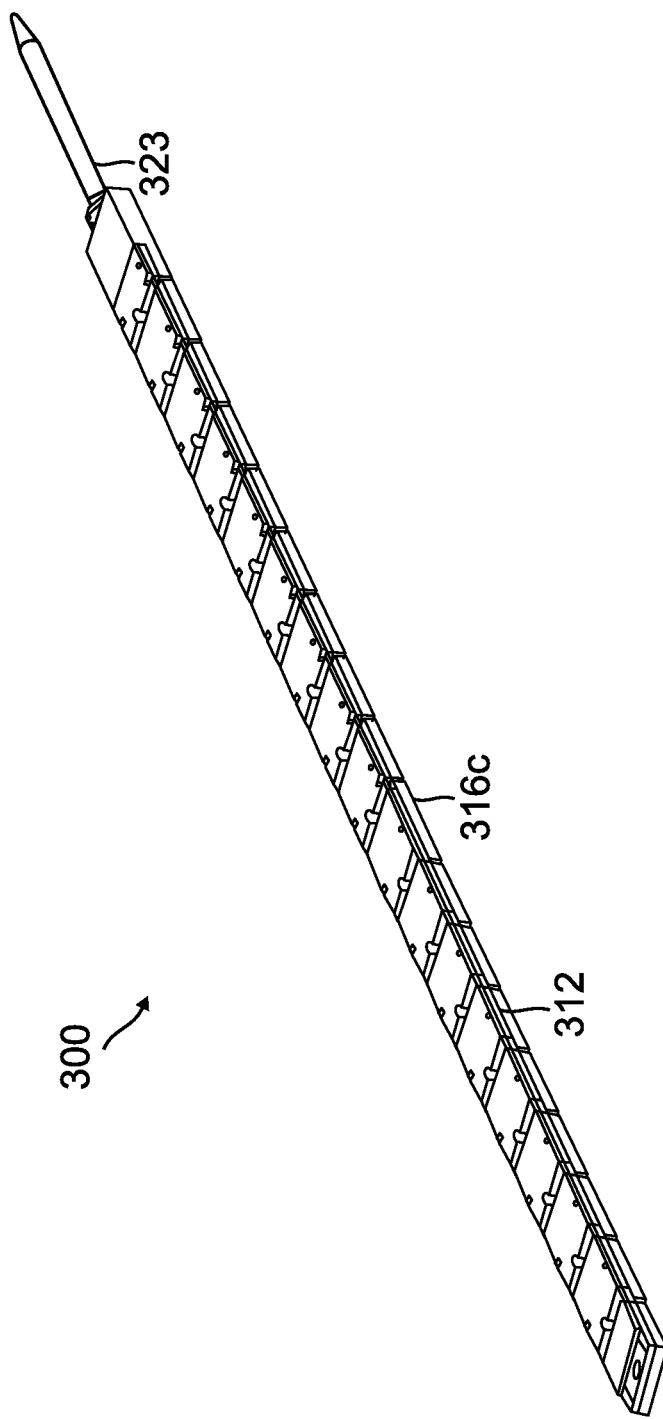
FIG. 3 illustrates an example embodiment of a feeding structure for an antenna array with a lightning rod attached thereto.

FIG. 3 illustrates an example embodiment of a feeding structure 300 for an antenna array with a lightning rod 323 attached thereto. In some embodiments, the one or more conductive layers 216 in FIGS. 2A and 2B have a physical geometry that is capable of functioning as a microwave ground for the feed network and can simultaneously function as a lightning ground for the antenna array 120 in FIG. 1A. In some embodiments, the layer that will function as a microwave ground and lightning ground for the feed network will be the bottom conductive layer 316c in the feeding structure and be about the length of the one or more circuit boards 312, as shown in FIG. 3. In some embodiments, when the bottom conductive layer 316c in the feeding structure functions as a lightning ground, a lightning rod 323 can be attached to the bottom conductive layer 316c, as shown in FIG. 3. In some of these embodiments, the bottom conductive layer 316c can span the length of the structure as illustrated in FIG. 3.

As mentioned above, one or more connectors 220 are coupled to the one or more circuits 214 through a solderable pin 226 (FIG. 2B) that extends through an opening 222 in the one or more conductive layers 216 to connect to the one or more circuits 214 as shown in FIGS. 2A and 2B. The one or more connectors 220 can be radio frequency (RF) connectors, coaxial connectors or other waveguide connecting structures that transfer electromagnetic energy. The coupler 224 (FIG. 2A) to the connector 220 can be connected to the one or more circuits 214 by soldering. Connecting the connector 220 to the one or more circuits 214 allows the one or more circuits 214 to distribute a feed signal through the one or more connectors 220 to one or more antenna elements in the antenna array 120 in FIG. 1A. The number of connectors 220 will usually depend on the number of distributed antenna elements that are in the antenna array 120. Further, as shown in FIG. 2A, the diameter 219 of the opening 222 through which the coupler 224 couples the connector 220 to the one or more circuits 214 can follow the same formula as discussed above. That is, $$Z_0 \approx \frac{138\Omega}{\sqrt{\varepsilon_r}} \log_{10} \frac{D_2}{d_2}$$

where $D_2$ is the diameter 219 of the opening 222 and $d_2$ is the diameter 221 of the coupler 224. Similarly, the diameter 219, $D_2$, of the opening 222 through which the connector 220 is coupled to the one or more circuits 214 in proportion to the diameter 221, $d_2$, of the coupler 224 that couples the connector 220 to the one or more circuits 212 is such that the one or more connector's 220 characteristic impedance can approximately match the characteristic impedance of any other devices it connects to, such as the one or more circuits 214. In an example, if the characteristic impedance $Z_0$=50Ω and the dielectric is air so that $\varepsilon_r$=1, then the diameter 219 of the opening 224 will approximately be 2.303 times larger than the diameter 221 of the coupler 224.

Figure 4:
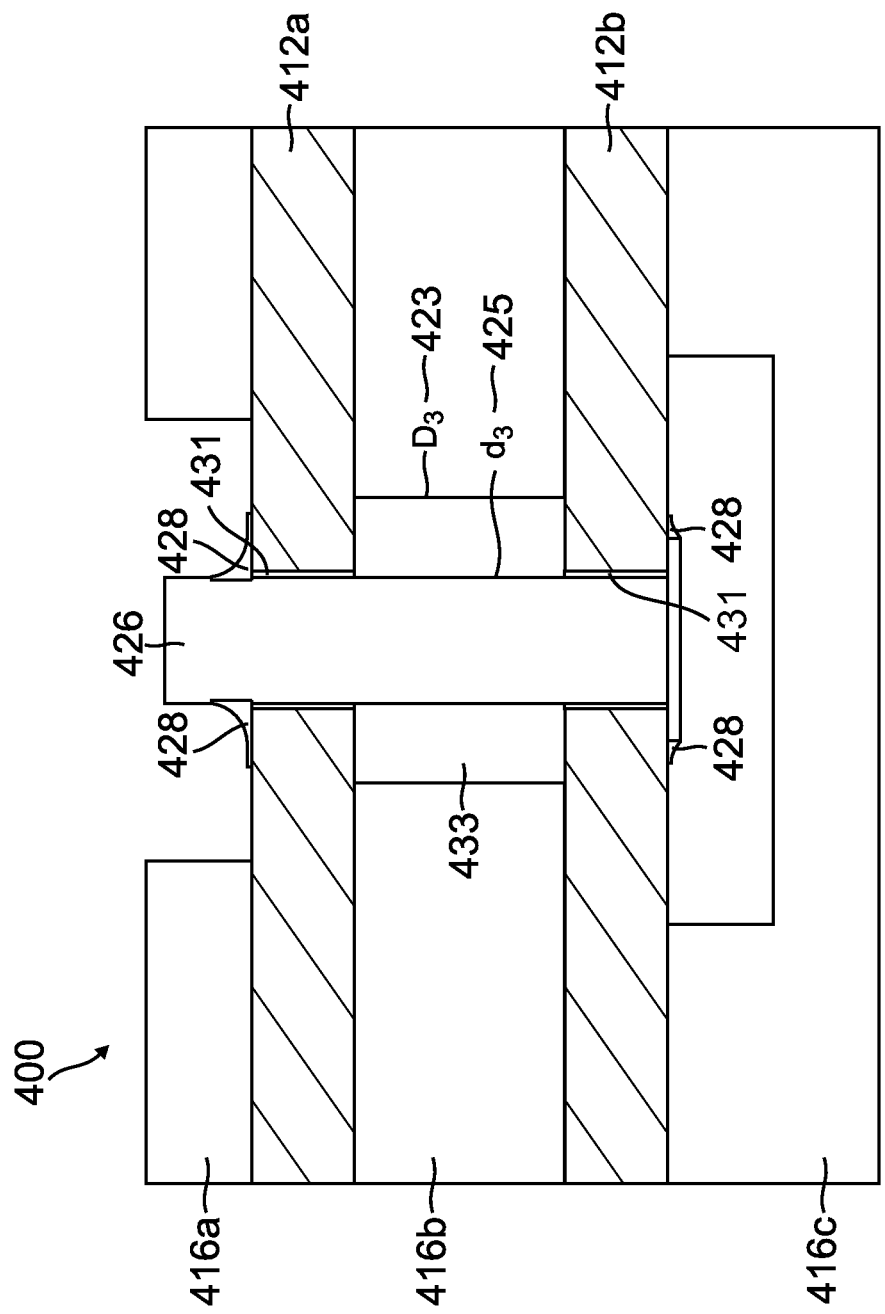
FIG. 4 illustrates an example embodiment of a side cross-sectional view of a feeding structure for an antenna array with a solderable pin incorporated into the structure.

FIG. 4 illustrates an example embodiment of a side cross-sectional view of a feeding structure 400 for an antenna array with a solderable pin 426 incorporated into the structure 400. In some embodiments in which there is more than one circuit board 212, as shown in FIGS. 2A and 2B, one or more solderable pins 426 can connect the different circuit boards 412a-412b as shown in FIG. 4. The solderable pin 426 is connected to the circuit boards 412a-412b by soldering 428. As shown in the figure, the solderable pin 426 extends through holes 431 in the first and second circuit boards 412a-412b and extends through a hole 433 in the middle conductive layer 416b. The soldering 428 is applied such that solderable pin 426 electrically connects a circuit formed on the first circuit board 412a to a circuit formed on the second circuit board 412b. The diameter 425, $d_3$, of the pin 426 in relation to the diameter 423, $D_3$, of the hole through the middle conductive layer 416b can follow the same formula above, i.e., $D_3$=2.303*$d_3$. Additionally, the first circuit board 412a, middle conductive layer 416b, and second circuit board 412b are bounded by the outer conductive layers 416a and 416c.

Figure 5:
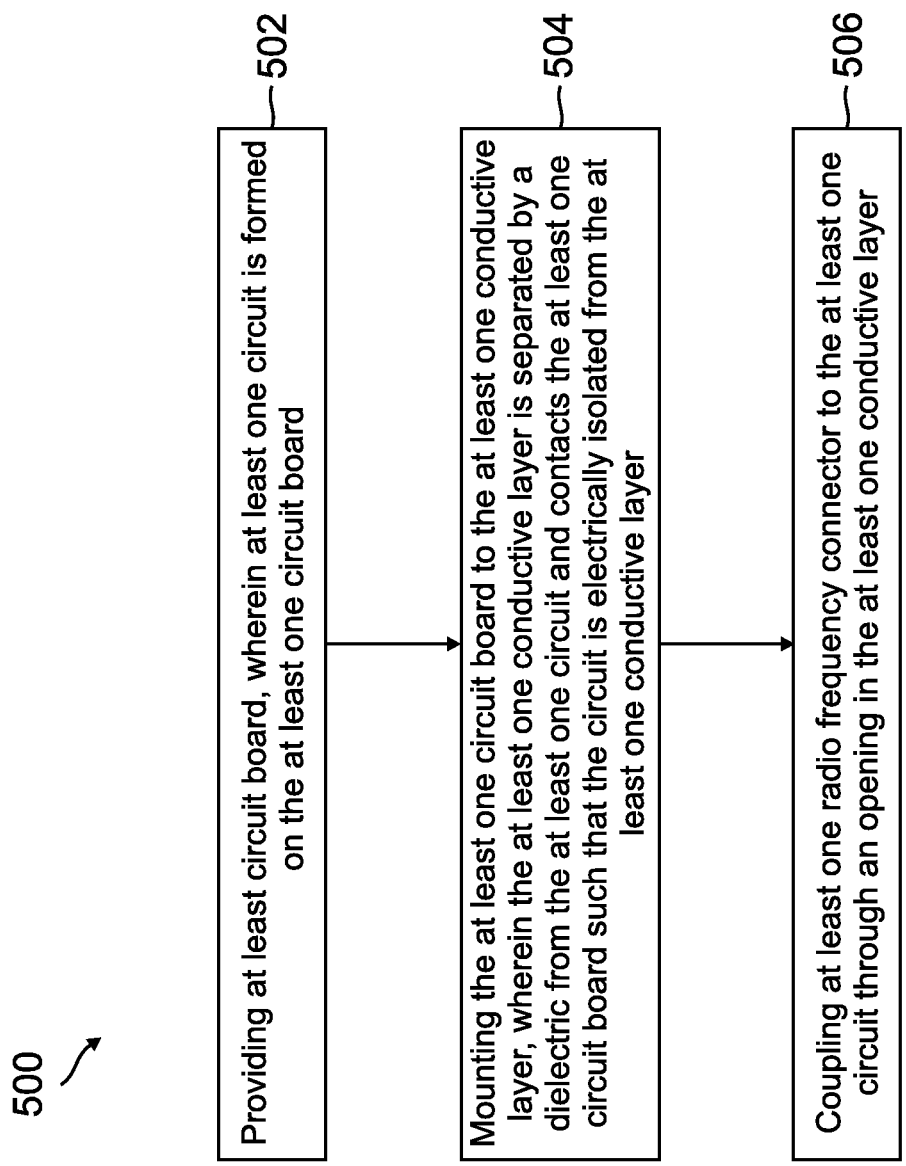
FIG. 5 is a flow diagram of an example of a method for constructing a feeding structure for an antenna array.

FIG. 5 is an exemplary flow chart illustrating one embodiment of a method of constructing a feeding structure for an antenna array 500. At block 502, one or more circuit boards with one or more circuits formed thereon is provided. At block 504, the one or more circuit boards are mounted onto one or more conductive layers. Moreover, the one or more conductive layers are separated from the one or more circuits by a dielectric such that the circuit is isolated from the one or more conductive layers. At block 506, one or more connectors are coupled to the one or more circuits through an opening in the one or more conductive layers. As mentioned above, the one or more connectors 220 can be radio frequency (RF) connectors, coaxial connectors or other waveguide connecting structures that transfer electromagnetic energy. Additional detail about the fabrication of the feeding structure is provided in FIGS. 6A-6E.

Figure 6A:
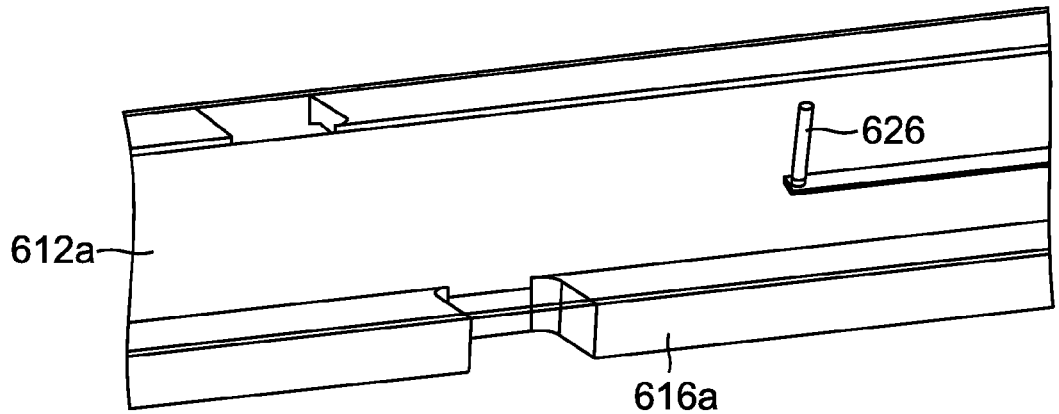
FIGS. 6A-6E are example embodiments of a method for constructing a feeding structure for an antenna array.
Figure 6B:
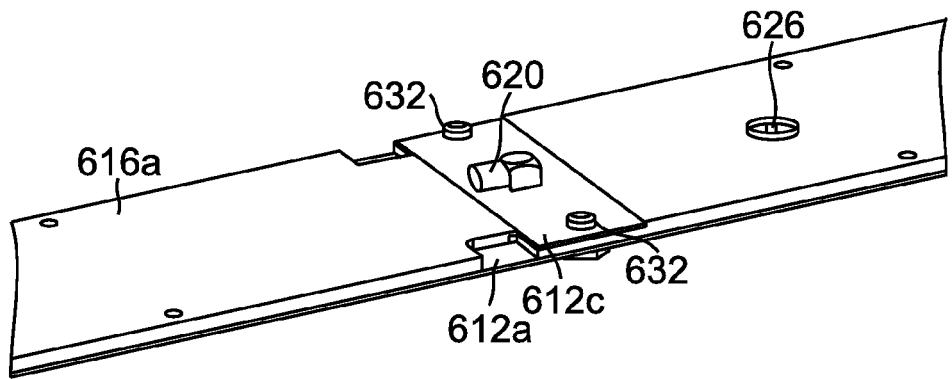

FIGS. 6A-6E are example embodiments of a method for constructing a feeding structure for an antenna array. Further, similar numbers represent the same parts. In FIG. 6A, one or more circuit boards 612a are provided (block 502 of FIG. 5). The one or more circuit boards 612a can have any of the characteristics of the circuit boards discussed above (e.g., being multi-layered). Thereafter, in some embodiments, mounting the at least one circuit board 612a to the one or more conductive layers 616a (block 504 of FIG. 5) can be accomplished by the following steps. One or more conductive layers 616a can be attached to the one or more circuit boards 612a using two short screws and nuts 632 as shown in FIG. 6B. The conductive layer 616a may be u-shaped so that the one or more circuits formed on the one or more circuit boards 612a will be isolated from the one or more circuits by a dielectric, as shown in FIGS. 6A and 2A above. The dielectric can be air, as discussed above. If one or more circuit boards are to be soldered together, a solderable pin 626 can be soldered to the circuit board 612a at this time as shown in FIG. 6A.

Figure 6C:
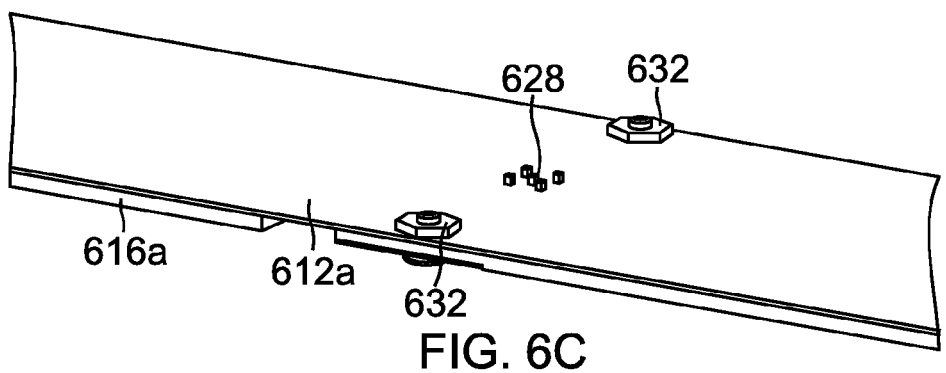

At this point in some embodiments, one or more connectors 620 can be coupled to the one or more circuit boards 612a by soldering 628 the one or more connectors 620 in FIG. 6B onto the one or more circuit boards 612a, as shown in FIG. 6C (block 506 of FIG. 5). As described above, the one or more connectors 220 in FIG. 2A can be radio frequency (RF) connectors, coaxial connectors or other waveguide connecting structures that transfer electromagnetic energy. In some embodiments, the one or more connectors 620 can be soldered onto a small piece of a circuit board 612c as shown in FIG. 6B. An advantage of assembling the connector 620 onto a small circuit board 612c is because a connector 620 that has a small dimension is sometimes not designed with a flange. In that case, the small circuit board 612c can be used to provide a reliable microwave ground connection between a connector 620 and one or more conductive layers 616a.

Figure 6D:
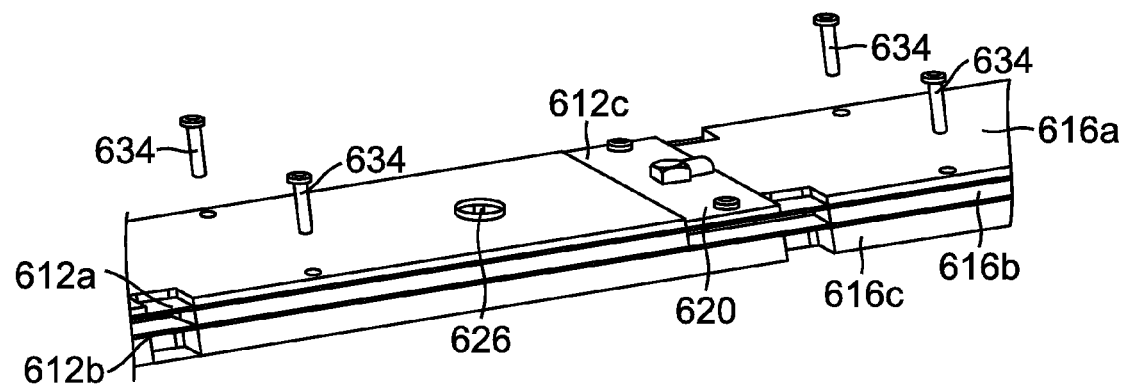

To complete the structure in this example embodiment, a middle conductive layer 616b, a second circuit board 612b and a bottom conductive layer 616c are attached using long screws 634 as shown in FIG. 6D. In some embodiments, the middle conductive layer 616b is h-shaped, so that it is isolated from the top circuit board 612a and the bottom circuit board 612b, as discussed above in relation to circuit board 212 in FIG. 2A above. In embodiments which have a solderable pin 626 connecting the one or more circuit boards 612a-612b, the middle conductive layer 616b can have one or more openings through which one or more solderable pins 626 can be inserted through. As discussed above in FIG. 4 in relation to solderable pin 426, the diameter of a hole through which a solderable pin 626 extends through can follow the relationship discussed above in relation to solderable pin 426 under FIG. 4. That is, the diameter of the hole in the middle conductive layer 616b can be roughly 2.303 times larger than the diameter of the solderable pin 626. Additionally, the bottom conductive layer is u-shaped 616c is u-shaped, similar to the top conductive layer 616a, so that it is isolated from the bottom circuit board 612b, as shown in FIGS. 6A and 2A. Before connecting the bottom conductive layer 616c, however, in embodiments that have a solderable pin 626 connecting one or more circuit boards 612a-612b, the solderable pin 626 can be soldered to the second circuit board 612b as discussed in FIG. 4. In some embodiments, the dielectric that isolates the circuits from the conductive layers 616a-616c can be air. Moreover, the distance between the conductive layers 616a-616c and the circuit boards 612a-612b can follow the relationship given above under FIG. 2A. That is, the distance between the surfaces of the conductive layers can be roughly 2.303 times larger than the width of the one or more circuit boards 612a-612b. After this structure is constructed, the circuit boards 612a-612b are mounted onto the conductive layers 616a-616c, wherein the conductive layers 616a-616c are separated by a dielectric from the one or more circuits and contact the one or more circuit boards such that the circuits are isolated from the one or more conductive layers (block 504). In addition, in some embodiments, the one or more conductive layers 616a-616c can be shorted together using one or more shorting members 229 on each side of the feeding structure, as was discussed in FIG. 2A above.

Figure 6E:
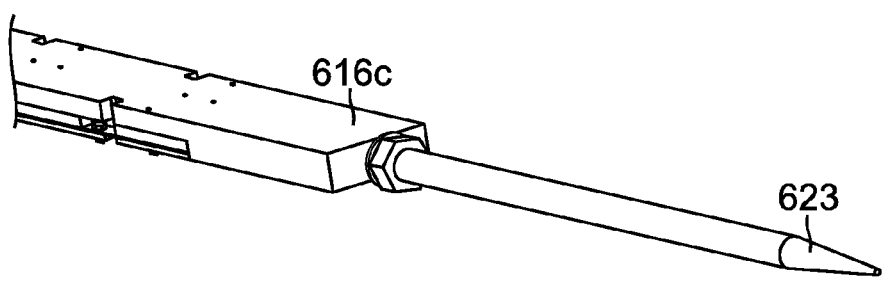

Moreover, in some embodiments, a conductive layer 616c that functions as a microwave ground for the feed can also function as a lightning ground for the antenna array. In which case, a lightning rod 623 can be connected to the conductive layer 616c as shown in FIG. 6E. The finished structure, which incorporates two circuit boards, one or more solderable pins connecting the two circuit boards, one or more connectors coupled to the circuit boards, and a lightning rod attached thereto is shown in FIG. 3 above.

Example Embodiments

Example 1 includes a feeding structure for an antenna array comprising: at least one circuit board, wherein at least one circuit is formed on the at least one circuit board; at least one conductive layer, wherein the at least one circuit board is mounted to the at least one conductive layer; and wherein the at least one conductive layer is separated by a dielectric from the at least one circuit and the at least one conductive layer contacts the at least one circuit board such that the at least one circuit is isolated from the at least one conductive layer; and at least one connector coupled to the at least one circuit through an opening in the at least one conductive layer.

Example 2 includes the feeding structure for an antenna array of Example 1, wherein the at least one circuit board comprises a first circuit board and a second circuit board.

Example 3 includes the feeding structure for an antenna array of Example 2, further comprising at least one solderable pin connecting the first circuit board to the second circuit board through an opening in one or more of the at least one conductive layer.

Example 4 includes the feeding structure for an antenna array of any of Examples 1-3, wherein the at least one circuit board is a multi-layer printed circuit board.

Example 5 includes the feeding structure for an antenna array of any of Examples 1-4, further comprising a lightning rod connected to the at least one conductive layer.

Example 6 includes the feeding structure for an antenna array of any of Examples 1-5, wherein the dielectric separating the at least one conductive layer from the at least one circuit is air.

Example 7 includes the feeding structure for an antenna array of any of Examples 1-6, wherein the diameter of the opening through which the connector is coupled to the at least one circuit is in proportion to the diameter of the coupler that couples the connector to the at least one circuit such that a connector's characteristic impedance approximately matches an at least one circuit's characteristic impedance.

Example 8 includes a method for constructing a feeding structure for an antenna array comprising: providing at least one circuit board, wherein at least one circuit is formed on the at least one circuit board; mounting the at least one circuit board to at least one conductive layer, wherein the at least one conductive layer is separated by a dielectric from the at least one circuit and the at least one conductive layer contacts the at least one circuit board such that the circuit is isolated from the at least one conductive layer; and coupling at least one connector to the at least one circuit through an opening in the at least one conductive layer.

Example 9 includes the method of Example 8, wherein the at least one circuit board comprises a first circuit board and a second circuit board.

Example 10 includes the method of Example 9, further comprising at least one solderable pin connecting the first circuit board to the second circuit board through an opening in one or more of the at least one conductive layer.

Example 11 includes the method of any of Examples 8-10, wherein the at least one circuit board is a multi-layered printed circuit board.

Example 12 includes the method of any of Examples 8-11, further comprising connecting a lightning rod to the at least one conductive layer.

Example 13 includes the method of any of Examples 8-12, wherein the dielectric that separates the at least one conductive layer from the at least one circuit is air.

Example 14 includes the method of any of Examples 8-13, wherein the diameter of the opening through which the connector is coupled to the at least one circuit is in proportion to the diameter of the coupler that couples the connector to the at least one circuit such that a connector's characteristic impedance approximately matches an at least one circuit's characteristic impedance.

Example 15 includes a driving network for an antenna array comprising: at least one printed circuit board, wherein the at least one printed circuit board has at least one circuit printed thereon, wherein the at least one printed circuit board is surrounded and supported by conductive material and suspended within the conductive material; and at least one connector coupled to the at least one circuit through an opening in the conductive material.

Example 16 includes the driving network for an antenna array of Example 15, wherein the at least one printed circuit board comprises a first circuit board and a second circuit board.

Example 17 includes the driving network for an antenna array of Example 16, further comprising at least one solderable pin connecting the first circuit board to the second circuit board through an opening in the conductive material.

Example 18 includes the driving network for an antenna array of any of Examples 15-17, wherein the at least one printed circuit board is multi-layered.

Example 19 includes the driving network for an antenna array of any of Examples 15-18, further comprising a lightning rod connected to the conductive material.

Example 20 includes the driving network for an antenna array of any of Examples 15-19, wherein the dielectric separating the conductive material from the at least one circuit is air.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method for constructing a feeding structure for an antenna array comprising:
    providing a first circuit board,
        wherein a first circuit is formed on the first circuit board;
    providing a second circuit board,
        wherein a second circuit is formed on the second circuit board;
    mounting the first and second circuit boards between different conductive layers in a plurality of conductive layers,
        wherein the plurality of conductive layers are separated by a dielectric from the first and second circuits and the conductive layers in the plurality of conductive layers that contact the first and second circuit boards such that the first and second circuits are isolated from the plurality of conductive layers; and
        wherein at least one solderable pin connects the first circuit board to the second circuit board through at least one opening in a middle conductive layer in the plurality of conductive layers; and
    coupling a plurality of connectors to the first circuit through a plurality of openings in an external conductive layer in the plurality of conductive layers.

2. The method of claim 1, further comprising connecting a lightning rod to the plurality of conductive layers.

3. The method of claim 1, wherein the dielectric that separates the plurality of conductive layers from the first and second circuits is air.

4. The method of claim 1, wherein a diameter of the opening through which the connector is coupled to the first circuit is in proportion to a diameter of the coupler that couples the connector to the first circuit such that a characteristic impedance of the connector approximately matches a first circuit's characteristic impedance.

5. A feeding structure for an antenna array comprising:
    a first circuit board,
        wherein a first circuit is formed on the first circuit board;
    a second circuit board,
        wherein a second circuit is formed on the second circuit board;
    a plurality of conductive layers,
        wherein the first and second circuit boards are mounted between different conductive layers in the plurality of conductive layers;
        wherein the plurality of conductive layers are separated by a dielectric from the first and second circuits and conductive layers in the plurality of conductive layers that contacts the first and second circuit boards contact the first and second circuit boards such that the first and second circuits are isolated from the plurality of conductive layers; and
        wherein at least one solderable pin electrically connects the first circuit to the second circuit through at least one opening in a middle conductive layer in the plurality of conductive layers; and
    a plurality of connectors coupled to the first circuit through a plurality of openings in an external conductive layer in the plurality of conductive layers.

6. The feeding structure for an antenna array of claim 5, wherein the dielectric separating the plurality of conductive layers from the first and second circuits is air.

7. The feeding structure for an antenna array of claim 5, wherein a diameter of the opening through which the connector is coupled to the first circuit is in proportion to a diameter of the coupler that couples the connector to the first circuit such that a characteristic impedance for the connector approximately matches a first circuit's characteristic impedance.

8. The feeding structure for an antenna array of claim 5, further comprising a lightning rod connected to the plurality of conductive layers.

9. A driving network for an antenna array comprising:
    a first printed circuit board;
    a second printed circuit board;
        wherein each of the first printed circuit board and the second printed circuit board has at least one circuit printed thereon,
        wherein the first printed circuit board and the second printed circuit board are surrounded and supported by conductive material and suspended within the conductive material and the at least one circuit on both the first printed circuit board and the second printed circuit board is isolated from the conductive material; and
    at least one solderable pin connecting the first circuit board to the second circuit board through an opening in the conductive material; and
    a plurality of connectors coupled to the at least one circuit on the first printed circuit board through a plurality of openings in the conductive material.

10. The driving network for an antenna array of claim 9, wherein the dielectric separating the conductive material from the at least one circuit is air.

11. The driving network for an antenna array of claim 9, further comprising a lightning rod connected to the conductive material.

* * * * *